US008701023B1

(12) United States Patent
Zhaksilikov et al.

(10) Patent No.: US 8,701,023 B1
(45) Date of Patent: *Apr. 15, 2014

(54) GLOBAL PARAMETER MANAGEMENT GRAPHICAL USER INTERFACE (GUI) FOR EMBEDDED APPLICATION DESIGN

(75) Inventors: Marat M. Zhaksilikov, Snohomish, WA (US); Kenneth Y. Ogami, Bothell, WA (US); Andrew Best, Spokane, WA (US)

(73) Assignee: Cypress Semiconductor Corporation, San Jose, CA (US)

( * ) Notice: Subject to any disclaimer, the term of this patent is extended or adjusted under 35 U.S.C. 154(b) by 644 days.

This patent is subject to a terminal disclaimer.

(21) Appl. No.: 11/707,202

(22) Filed: Feb. 14, 2007

Related U.S. Application Data

(60) Provisional application No. 60/774,295, filed on Feb. 16, 2006.

(51) Int. Cl.
| | |
|---|---|
| *G06F 3/048* | (2013.01) |
| *G06F 3/00* | (2006.01) |
| *H03K 19/0175* | (2006.01) |
| *G06F 1/32* | (2006.01) |

(52) U.S. Cl.
CPC .......... *H03K 19/0175* (2013.01); *G06F 1/3203* (2013.01); *G06F 3/048* (2013.01)
USPC .............. 715/762; 326/62; 717/100; 717/178

(58) Field of Classification Search
CPC .... H03K 19/0175; G06F 1/3203; G06F 3/048
USPC ........................ 326/62; 715/762; 719/321, 327
See application file for complete search history.

(56) References Cited

U.S. PATENT DOCUMENTS

| | | | |
|---|---|---|---|
| 4,488,256 A * | 12/1984 | Zolnowsky et al. | .......... 711/210 |
| 4,837,676 A | 6/1989 | Rosman | |
| 4,837,682 A | 6/1989 | Culler | |
| 4,975,865 A | 12/1990 | Carrette | |
| 5,179,660 A | 1/1993 | Devany | |
| 5,193,187 A | 3/1993 | Strout, II | |
| 5,210,750 A | 5/1993 | Nassehi | |
| 5,243,529 A | 9/1993 | Kashiwazaki | |
| 5,260,611 A | 11/1993 | Cliff | |
| 5,262,943 A | 11/1993 | Thibado | |
| 5,289,535 A | 2/1994 | Bogart | |
| 5,298,805 A | 3/1994 | Garverick et al. | |
| 5,313,620 A | 5/1994 | Cohen | |
| 5,317,209 A | 5/1994 | Garverick | |
| 5,323,069 A | 6/1994 | Smith, Jr. | |
| 5,338,984 A | 8/1994 | Sutherland | |
| 5,339,392 A | 8/1994 | Risberg | |
| 5,345,380 A | 9/1994 | Babson, III | |
| 5,369,742 A | 11/1994 | Kurosu | |

(Continued)

OTHER PUBLICATIONS

Tech Support, Apr. 2003, vol. 4, Issue 4, 6 Pages.*

(Continued)

*Primary Examiner* — Ece Hur

(57) ABSTRACT

A design tool provides a conflict management graphical user interface (GUI). The conflict management GUI notifies a user that requested values of a global resource result in a conflict during development of an embedded application. The conflict management GUI further provides the user with a user interface element to adjust the requested values until the conflict is resolved.

16 Claims, 9 Drawing Sheets

(56) References Cited

U.S. PATENT DOCUMENTS

| | | | |
|---|---|---|---|
| 5,371,684 A | 12/1994 | Iadonato | |
| 5,436,575 A | 7/1995 | Pedersen | |
| 5,442,763 A | 8/1995 | Bartfai | |
| 5,504,899 A | 4/1996 | Raz | |
| 5,506,963 A | 4/1996 | Ducateau | |
| 5,546,595 A | 8/1996 | Norman et al. | |
| 5,574,655 A | 11/1996 | Knapp | |
| 5,590,342 A | 12/1996 | Marisetty | |
| 5,598,545 A | 1/1997 | Childers | |
| 5,615,389 A * | 3/1997 | Mayfield et al. | 710/8 |
| 5,619,456 A | 4/1997 | McClure | |
| 5,628,025 A | 5/1997 | Chung | |
| 5,634,004 A | 5/1997 | Gopinath | |
| 5,648,795 A | 7/1997 | Vouri | |
| 5,745,750 A | 4/1998 | Porcaro | |
| 5,745,904 A | 4/1998 | King | |
| 5,761,138 A | 6/1998 | Lee | |
| 5,764,089 A | 6/1998 | Partovi | |
| 5,764,984 A | 6/1998 | Loucks | |
| 5,774,005 A | 6/1998 | Partovi | |
| 5,781,720 A * | 7/1998 | Parker et al. | 714/38.11 |
| 5,801,967 A | 9/1998 | Henderson | |
| 5,832,211 A | 11/1998 | Blakley, III | |
| 5,930,336 A | 7/1999 | Junqua | |
| 5,966,729 A | 10/1999 | Phelps | |
| 5,990,717 A | 11/1999 | Partovi | |
| 6,014,036 A | 1/2000 | Bozso | |
| 6,034,541 A | 3/2000 | Kopec, Jr. | |
| 6,072,431 A | 6/2000 | Froeberg | |
| 6,085,317 A | 7/2000 | Smith | |
| 6,104,251 A | 8/2000 | Culler | |
| 6,137,466 A | 10/2000 | Moughanni | |
| H001920 H | 11/2000 | Xu | |
| 6,161,151 A | 12/2000 | Sudhakaran et al. | |
| 6,188,262 B1 | 2/2001 | Sutherland | |
| 6,219,785 B1 | 4/2001 | Smith | |
| 6,242,950 B1 | 6/2001 | Bozso | |
| 6,252,544 B1 | 6/2001 | Hoffberg | |
| 6,266,041 B1 | 7/2001 | Cairns | |
| 6,275,920 B1 * | 8/2001 | Abercrombie et al. | 712/14 |
| 6,285,966 B1 | 9/2001 | Brown | |
| 6,292,830 B1 | 9/2001 | Taylor | |
| 6,332,160 B1 | 12/2001 | Tabuchi | |
| 6,366,653 B1 | 4/2002 | Yeh | |
| 6,374,369 B1 | 4/2002 | O'Donnell | |
| 6,429,812 B1 | 8/2002 | Hoffberg | |
| 6,434,447 B1 * | 8/2002 | Shteyn | 700/245 |
| 6,540,674 B2 | 4/2003 | Zadrozny | |
| 6,559,861 B1 | 5/2003 | Kennelly | |
| 6,636,901 B2 * | 10/2003 | Sudhakaran et al. | 719/327 |
| 6,781,991 B1 | 8/2004 | Anderlind | |
| 6,809,736 B1 | 10/2004 | Stauffer | |
| 6,917,812 B2 | 7/2005 | Damnjanovic | |
| 6,941,477 B2 | 9/2005 | O'Keefe | |
| 7,028,019 B2 * | 4/2006 | McMillan et al. | 707/691 |
| 7,047,521 B2 * | 5/2006 | Bunnell | 717/130 |
| 7,053,863 B2 * | 5/2006 | Glen et al. | 345/2.3 |
| 7,058,626 B1 | 6/2006 | Pan | |
| 7,085,752 B2 | 8/2006 | Mortensen | |
| RE39,284 E | 9/2006 | Marisetty | |
| 7,145,362 B1 | 12/2006 | Bergendahl | |
| 7,171,686 B1 * | 1/2007 | Jansen et al. | 726/17 |
| 7,174,548 B2 * | 2/2007 | Louzoun et al. | 717/173 |
| 7,184,359 B1 * | 2/2007 | Bridgewater et al. | 365/189.16 |
| 7,212,999 B2 | 5/2007 | Friesen | |
| 7,246,193 B2 | 7/2007 | Rotvold | |
| RE39,837 E | 9/2007 | Marisetty | |
| 7,275,096 B2 * | 9/2007 | Green | 709/223 |
| 7,281,040 B1 * | 10/2007 | Ly | 709/224 |
| 7,284,157 B1 * | 10/2007 | McMichael et al. | 714/38.13 |
| 7,346,705 B2 | 3/2008 | Hullot | |
| 7,461,358 B2 * | 12/2008 | Wu | 715/866 |
| 7,464,370 B2 | 12/2008 | Barsness | |
| 7,487,471 B2 * | 2/2009 | Wu | 715/866 |
| 7,502,031 B1 * | 3/2009 | Pike et al. | 345/589 |
| 7,506,274 B2 | 3/2009 | Zhang | |
| 7,506,305 B2 | 3/2009 | Cornelius et al. | |
| 7,522,125 B2 * | 4/2009 | Glen et al. | 345/2.3 |
| 7,546,611 B2 * | 6/2009 | Kim et al. | 719/320 |
| 7,551,832 B2 | 6/2009 | Plourde, Jr. | |
| 7,643,417 B2 | 1/2010 | Van Nieuwenhuizen | |
| 7,683,872 B2 * | 3/2010 | Jan et al. | 345/96 |
| 7,685,105 B2 | 3/2010 | Rosenblum | |
| 7,715,339 B2 | 5/2010 | Sarja | |
| 7,730,167 B2 | 6/2010 | Starbuck | |
| 7,779,046 B2 | 8/2010 | Hwang | |
| 7,834,882 B2 | 11/2010 | Stauffer | |
| 7,856,422 B2 | 12/2010 | Linkert | |
| 7,861,273 B2 | 12/2010 | Fries et al. | |
| 8,028,258 B1 * | 9/2011 | Ogami et al. | 716/110 |
| 8,051,381 B2 * | 11/2011 | Ebrom et al. | 715/762 |
| 8,074,231 B2 * | 12/2011 | Hunt et al. | 719/321 |
| 2002/0157043 A1 | 10/2002 | Hite et al. | |
| 2002/0169804 A1 | 11/2002 | Faist | |
| 2003/0014381 A1 * | 1/2003 | McMillan et al. | 707/1 |
| 2003/0023772 A1 * | 1/2003 | Slivka et al. | 709/327 |
| 2003/0167454 A1 | 9/2003 | Iordanov et al. | |
| 2004/0103434 A1 | 5/2004 | Ellis | |
| 2004/0153830 A1 * | 8/2004 | Cebula et al. | 714/38 |
| 2005/0015639 A1 * | 1/2005 | Cornelius et al. | 714/1 |
| 2005/0060723 A1 * | 3/2005 | Eldar | 719/321 |
| 2005/0097168 A1 | 5/2005 | Mukherjee | |
| 2005/0177632 A1 | 8/2005 | Yach | |
| 2005/0256907 A1 | 11/2005 | Novik | |
| 2006/0103867 A1 * | 5/2006 | Kato | 358/1.13 |
| 2006/0168586 A1 | 7/2006 | Stone | |
| 2006/0212330 A1 | 9/2006 | Savilampi | |
| 2006/0259885 A1 | 11/2006 | Mortensen et al. | |
| 2006/0271537 A1 | 11/2006 | Chandrasekharan | |
| 2007/0050710 A1 | 3/2007 | Redekop | |
| 2007/0094673 A1 * | 4/2007 | Hunt et al. | 719/321 |
| 2007/0130548 A1 * | 6/2007 | Zhaksilikov et al. | 716/1 |
| 2007/0156512 A1 | 7/2007 | Yerkie | |
| 2008/0133598 A1 * | 6/2008 | Williams et al. | 707/104.1 |
| 2008/0140677 A1 | 6/2008 | Shin | |
| 2009/0013270 A1 | 1/2009 | Helfman | |
| 2009/0089039 A1 | 4/2009 | Shufer | |
| 2010/0251233 A1 * | 9/2010 | Majewski et al. | 718/1 |
| 2011/0202918 A1 * | 8/2011 | Park et al. | 718/1 |

OTHER PUBLICATIONS

Tech Support, Apr. 2003, vol. 4, Issue 4, 1 Page Image.*
Person et al., Special Edition Using Windows 95, Second Edition, 1997, pp. 194-196.*
David Stepner et all., Embedded Application Design Using a Real-Time OS. ACM, 1999. pp. 1-6.*
USPTO Notice of Allowance for U.S. Appl. No. 11/512,545 Oct. 7, 2008; 7 pages.
USPTO Non-Final Rejection for U.S. Appl. No. 11/512,545 May 13, 2008; 7 pages.
Cypress, Application Note, "PSoC Express TM Primer: First Introduction," AN2261, Revision A, Mar. 15, 2005, pp. 1-19.
Cypress Micorsystems, Application Note, "Global Resources in PSoC TM Designer," AN2221, Revision A, Oct. 15, 2004, 7 pages.
Cypress Perform, PSoC Designer TM, IDE User Guide, Document #38-12002 Rev. B, 2002-2005, 193 pages.
USPTO Final Rejection for U.S. Appl. No. 11/707,201 dated Mar. 2, 2011; 20 pages.
USPTO Non-Final Rejection for U.S. Appl. No. 11/707,201 dated Sep. 14, 2010; 20 pages.
Oleg Sokolsky, "Resource Modeling for Embedded Systems Design," IEEE, 2004, 6 pages.
Stepner et al., "Embedded Application Design Using a Real-Time OS," ACM, 1999, 6 pages.
USPTO Advisory Action for U.S. Appl. No. 11/707,201 dated Sep. 6, 2012; 3 pages.
USPTO Final Rejection for U.S. Appl. No. 11/707,201 dated Jul. 3, 2012; 21 pages.

(56) References Cited

OTHER PUBLICATIONS

USPTO Non Final Rejection for U.S. Appl. No. 11/707,201 dated Jan. 31, 2012; 21 pages.
USPTO Non-Final Rejection for U.S. Appl. No. 11/707,201 dated Sep. 25, 2013; 12 pages.
U.S. Appl. No. 11/707/201: "Global Resource Conflict Management for an Embedded Application Design" Kenneth Y. Ogami et al., filed on Feb. 14, 2007; 37 pages.
USPTO Advisory Action for U.S. Appl. No. 11/707,201 dated May 9, 2011; 3 pages.

* cited by examiner

GLOBAL PARAMETER MANAGEMENT GRAPHICAL USER INTERFACE (GUI) FOR EMBEDDED APPLICATION DESIGN

CROSS-REFERENCE TO RELATED APPLICATIONS

This application claims the benefit of U.S. Provisional Application No. 60/774,295, filed Feb. 16, 2006, and incorporated herein by reference in its entirety.

TECHNICAL FIELD

Embodiments of the invention relate generally to embedded application development and more specifically, but not exclusively, to resolving conflicting global parameters using a graphical user interface during development of an embedded application.

BACKGROUND

Shortened time to design and user error reduction are essential to the success of application development environments. Current application development environments are geared towards system engineers. Conventional design tools generally fail to produce deterministic outcomes when conflicting driver properties are set in a design. This is because conventional drivers are allowed to modify global resources without regard to conflicting values requested by other drivers. Thus, in a conventional embedded application design, conflicts are generally managed manually. As a result, a system engineer would often need to manually modify the conflicting driver properties when adding, deleting, or modifying drivers that request different parameter settings of a global resource.

Moreover, system engineers are typically accustomed to describing a design at a higher level than the hardware level. For example, a clock driver may be described at the system level in terms of clock frequency. However, at the hardware level, clock distribution is often described by clock divider ratios. Thus, with conventional design tools, a user may need to hand code in assembly or C code to manually modify conflicting driver properties at a hardware level. Such an approach may be too low level for system designers. Thus, the conventional approach is inefficient and error prone.

BRIEF DESCRIPTION OF THE DRAWINGS

The present invention is illustrated by way of example and not limitation in the figures of the accompanying drawings, in which.

DETAILED DESCRIPTION

In the following description, for purposes of explanation, numerous specific details are set forth in order to provide a thorough understanding of the present invention. It will be evident, however, to one skilled in the art that the present invention may be practiced without these specific details. In other instances, well-known circuits, structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment.

Global parameter conflict management resolves conflicting requests by drivers on a common global resource. In the following descriptions, drivers are associated with a hardware component of a processing device for an embedded application. Details about the drivers are described later with reference to FIG. 6. Different drivers may request different values of a driver property supported by a global resource. These different property values may sometimes cause a conflict in the global resource. For example, a clock may be a global resource and the frequency of the clock may be the requested driver property. Clock divider hardware may be used to divide a global clock into different clock frequencies. However, it is sometimes not possible to divide a global clock to match the exact clock frequencies requested by the drivers. When a global resource cannot satisfy the requests of the drivers, a conflict occurs. Conflicts may also arise when drivers requesting other global resources, e.g., voltage distributor and other types of global resources.

Embodiments of present invention provide a conflict management GUI to assist users in resolution of conflicts caused by different requested values of a driver property. It is understood that the driver property value referred to herein correspond to a parameter setting of the global resource. Thus, in the following descriptions, the terms "driver property value" and "parameter setting" are used synonymously. The conflict management GUI cooperates with a conflict manager that evaluates and resolves contentions among the global parameter settings requested by multiple drivers. Managing global parameter conflicts typically involves an intimate knowledge of the processing device and corresponding database elements. The introduction of a conflict management GUI greatly simplifies the design process and increases user's productivity.

Figure 1:
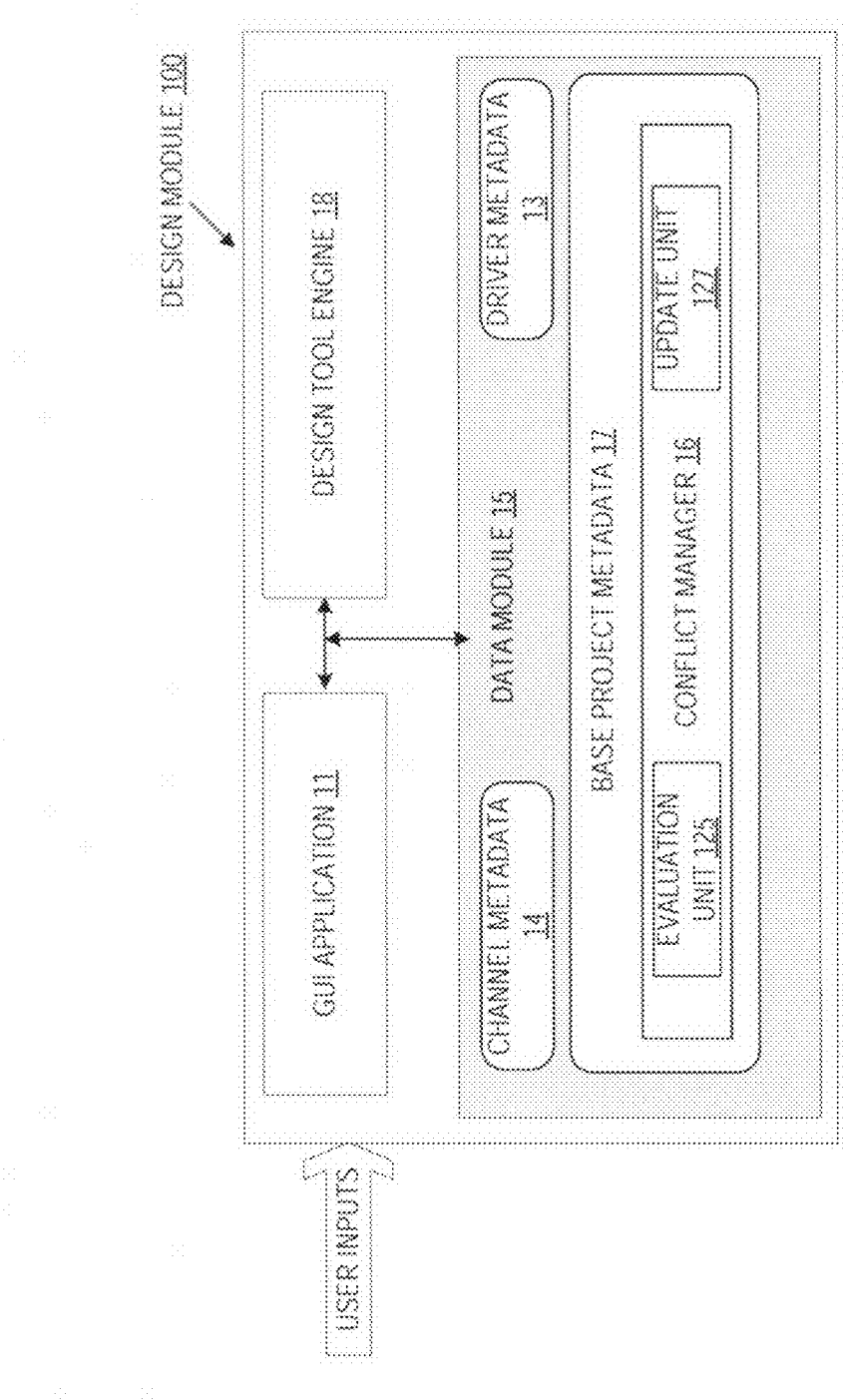
FIG. 1 is a block diagram of one embodiment of a design module that facilitates global parameter conflict management.

FIG. 1 illustrates one embodiment of a design module 100 that performs global resource conflict management. Design module 100 forms at least a portion of a design tool that facilitates a user to design an embedded system on a chip. In this embodiment, design module 100 includes a graphical user interface (GUI) application 11 that renders a conflict management GUI to assist a user in resolving conflicts on a global resource. Design module 100 also includes a design tool engine 18 that configures a processing device into an embedded system according to a user's system-level specification.

Design module further includes one or more conflict managers 16 (only one is shown). Conflict managers 16 operate in conjunction with the conflict management GUI to resolve conflicting requests on global resource settings. Each conflict manager 16 manages conflicts for an associated global resource. For example, a clock source may be managed by a clock manager and a voltage source may be managed by a voltage manager. Other types of conflict managers may exist for different global resources. Conflict manager 16 includes an evaluation unit 125, which evaluates driver requests to determine whether a conflict exists. Conflict manager 16 also includes an update unit 127, which calculates alternative values to resolve the conflict.

Conflict manager 16 may be part of a data module 15 that includes driver metadata 13, channel metadata 14, and base project metadata 17. Driver metadata 13, channel metadata 14, and base project metadata 17 may be managed and coordinated by design tool engine 18. In the embodiment as shown, conflict manager 16 may be implemented by a manager script in base project metadata 17. The manager script defines management rules, and may include a conflict resolution algorithm. Each global resource may be associated with a conflict manger 16 that operates according to a set of management rules tailored to that global resource. The manager script may be added or modified without any change to the design tool engine code. Examples of the manager script may include JavaScript and other suitable scripting languages. Alternatively, the management rules and the manager script may be specified at a system level, a Maker application level, or an individual design project level, as long as they define a consistent behavior in conflict resolution. More details on the levels of design module 100 are described later with reference to FIGS. 5-8.

Driver metadata 13 may include an attribute indicating whether a driver property involves a global resource. Driver metadata 13 may also include, but is not limited to, the name of an associated channel property, the property values requested by the respective driver, a script that translates a driver property value to a corresponding channel property value, and a script that translates a channel property value to a corresponding driver property value.

Channel metadata 14 defines the properties that can be associated with conflict managers 16. Channel metadata 14 may include a script, e.g., JavaScript or other scripting languages, to apply the results of the manager script. Channel metadata 14 forms, at least in part, a channel that acts as a proxy for the associated driver with respect to global resource management, thus hiding hardware complexities from the drivers. A channel may be associated with one or more conflict managers 16. When a driver is added, the associated channel registers a request on behalf of the driver with the appropriate conflict manager 16. When a driver is deleted, the associated channel removes the request on behalf of the driver from the appropriate conflict manager. When a driver modifies a property value, the associated channel updates the value request. More details about the drivers, channels, and base projects are described later with reference to FIGS. 6-8.

Figure 2:
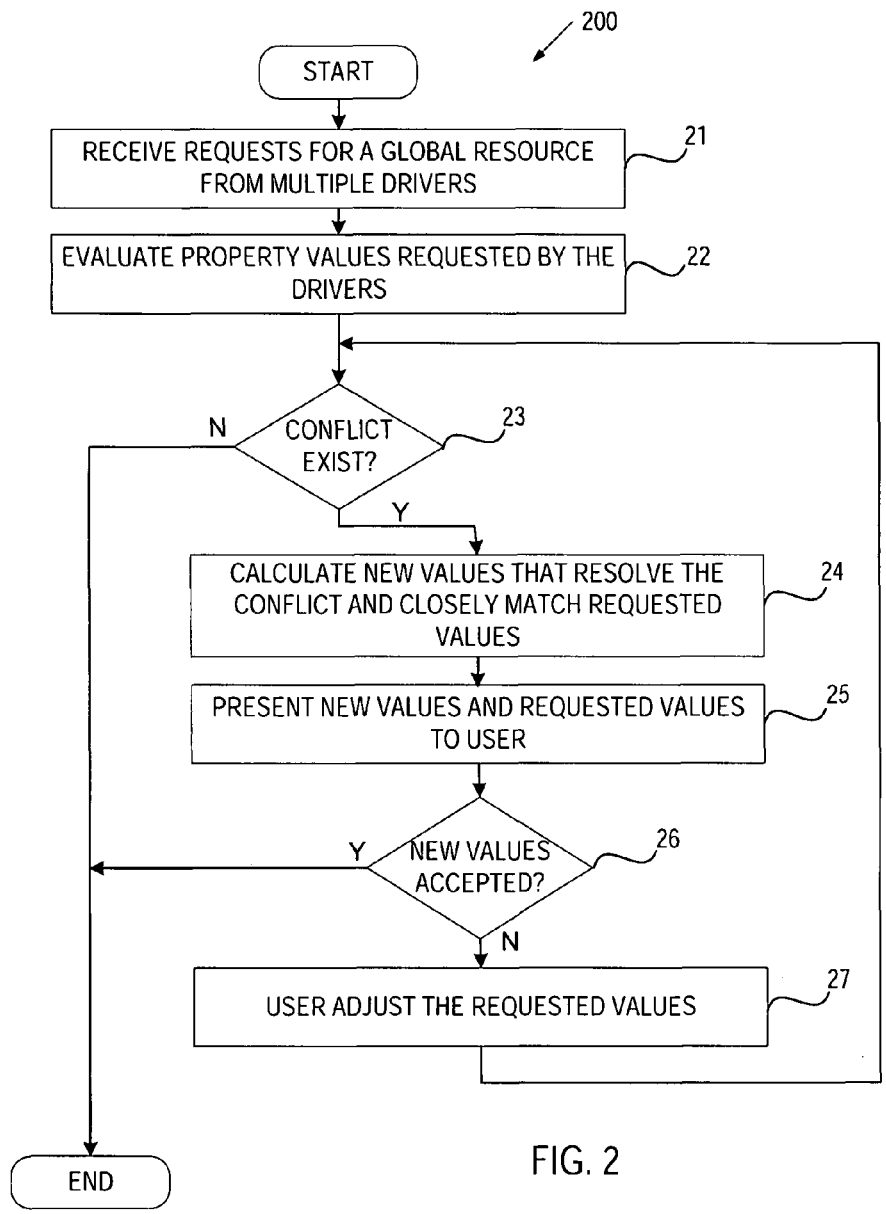
FIG. 2 is a flow diagram of one embodiment of a method that facilitates the global parameter conflict management.

A conflict may be resolved by an interactive process 200 as illustrated in the embodiment of FIG. 2. Interactive process 200 may be performed by processing logic of design module 100. Processing logic may comprise hardware (e.g., circuitry, dedicated logic, programmable logic, microcode, etc.), software (such as run on a general purpose computer system or a dedicated machine), or a combination of both.

At block 21, design module 100 receives a user design that includes a plurality of drivers, each requesting a different property value for a common global resource. For example, the drivers may be pulse width modulation (PWM) drivers that request different clock frequencies. At block 22, conflict manager 16 evaluates property values requested by the drivers to determine whether there is a conflict. If there is no conflict (block 23), process 200 ends. If a conflict exists (block 23), conflict manager 16 calculates, at block 24, new property values that resolve the conflict and closely match the driver requests. The new property values may optimize an error metric, e.g., a total average error, a mean square error, or other suitable metrics. At block 25, a conflict management graphical user interface (GUI) is presented to the user. The conflict management GUI presents the new values as well as the requested values. The new values are proposed to the user as an alternative to the requested values. If the user accepts the new values (block 26), process 200 ends and the conflict is resolved. If the user does not accept the new values, at block 27, the user may adjust the requested values and repeat process 200 at blocks 23-27. Process 200 ends when the user accepts the new values proposed by conflict manager 16 or when the user adjustment to the requested values resolves the conflict.

Figure 3:
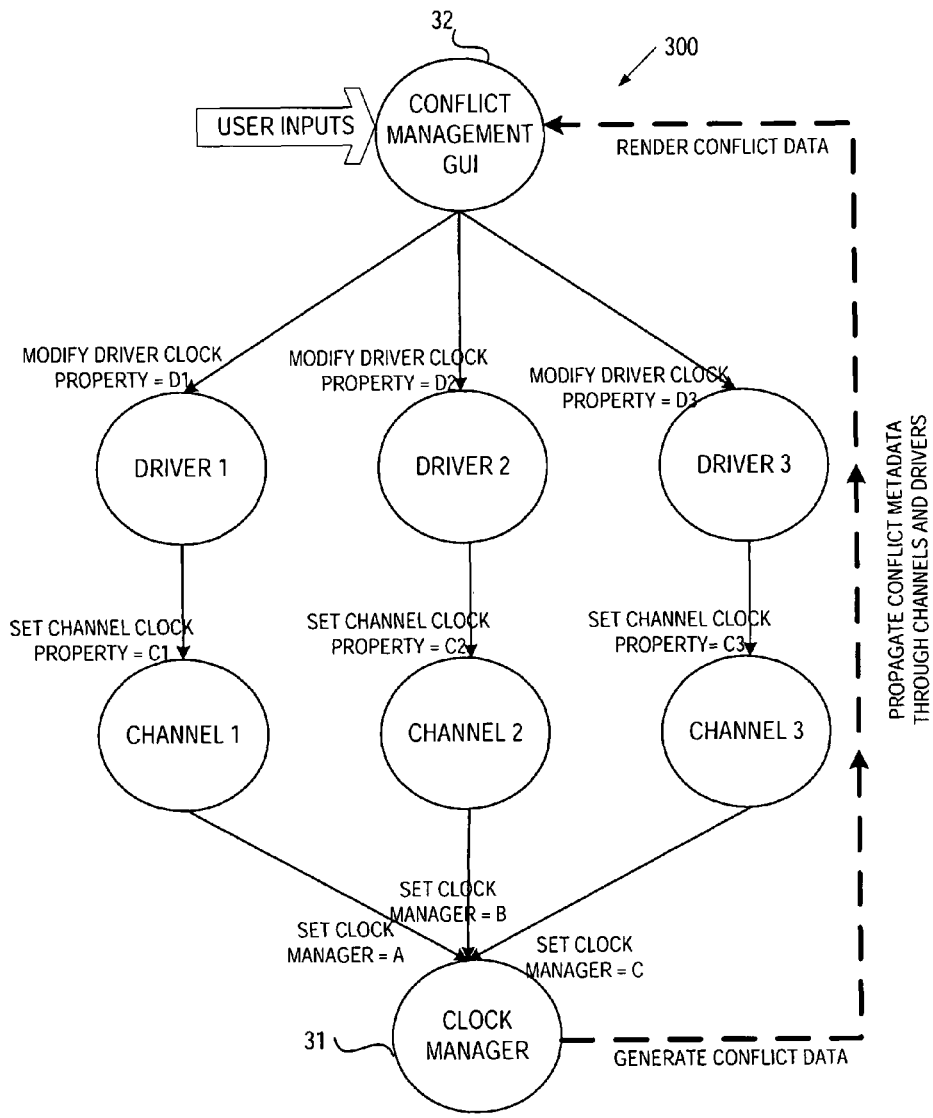
FIG. 3 illustrates an embodiment of operations for resolving conflicts in parameter settings of a global clock resource.

FIG. 3 illustrates an operation flow 300 for resolving conflicts on a clock according to one embodiment of the invention. Operation flow 300 may be performed by processing logic of design module 100. Processing logic may comprise hardware (e.g., circuitry, dedicated logic, programmable logic, microcode, etc.), software (such as run on a general purpose computer system or a dedicated machine), or a combination of both.

In this embodiment, a global clock resource is managed by a clock manager 31. Other global resources may also be used in place of the clock. Operation flow 300 illustrates that a conflict management GUI 32, as directed by a user, submits requests to set or modify the driver clock property to different values. The driver clock property may represent a clock property at a system level meaningful to the user. For example, the driver clock property may represent the clock frequency. Each driver converts the request to the corresponding channel clock property, and passes it on to its associated channel. The corresponding channel clock property may be a lower-level description of the clock than the driver clock property. Each channel converts the channel clock property to a hardware property of the clock, and requests clock manager 31 to set the hardware property of the clock to a different value. For example, the hardware property of the clock may be a clock divider that divides the clock to the requested clock frequency. Clock manager 31 evaluates the different requests and configures the clock according to the requests if no conflict is identified. If a conflict is identified, clock manager 31 calculates alternative values that resolve the conflict, generates conflict metadata including the alternative values, and propagates the conflict metadata through channels and drivers to conflict management GUI 32. The alternative values may be proposed to the user as a guide in the resolution of the conflict.

An example of a user interface (UI) will now be described with reference to FIG. 4. The exemplary UI may be generated in a variety of ways, such as using HyperText Markup Language (HTML), JavaScript, or the like. It will be understood that embodiments of the present invention are not limited to the UIs discussed herein.

Figure 4:
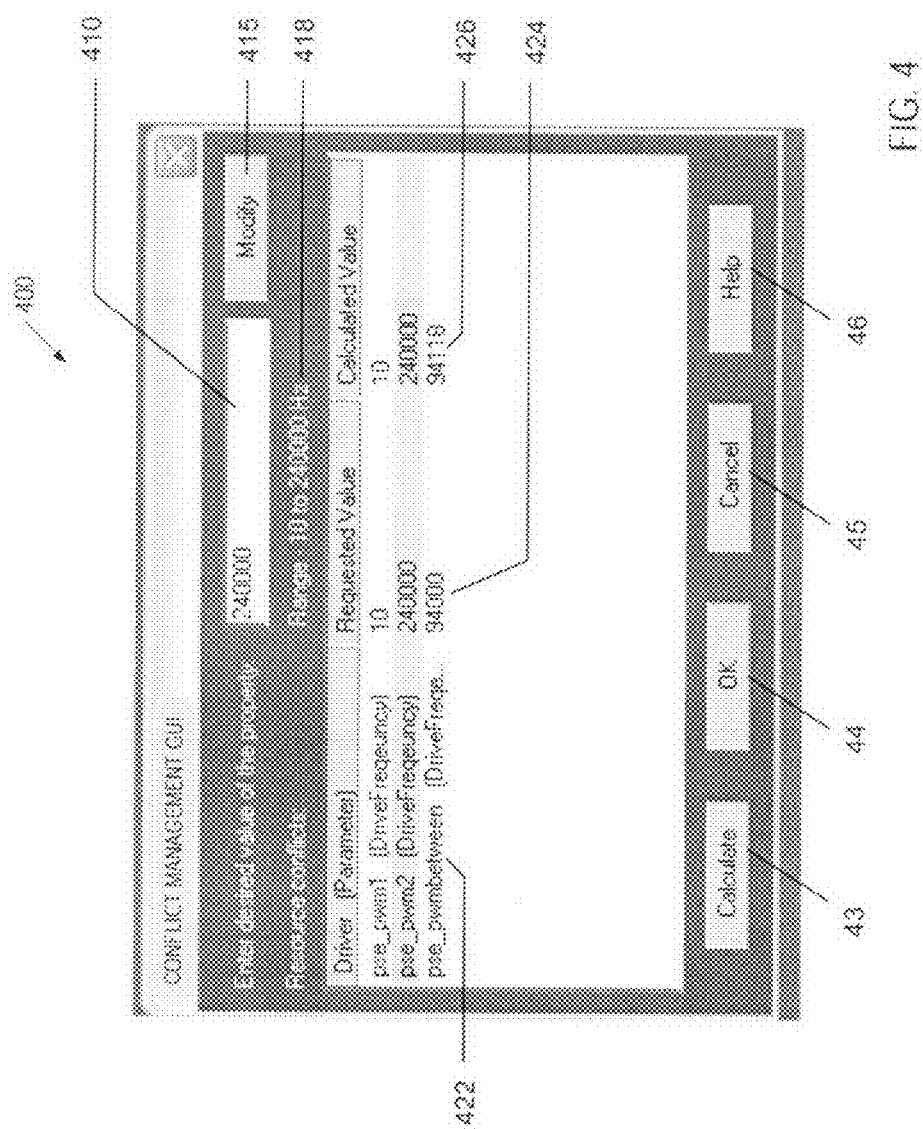
FIG. 4 illustrates an embodiment of conflict management graphical user interface (GUI).

FIG. 4 illustrates an embodiment of a conflict management GUI 400. In this embodiment, GUI 400 displays a first list 422 of driver name elements to identify the drivers that cause the conflict. First list 422 may also show the requested driver parameter (or equivalently, the requested driver property) in a parenthesis. A second list 424 displays the requested values of the driver property, and a third list 426 displays the calculated values (or equivalently, the proposed new values) of the driver property. In this embodiment, three drivers pse_pwm1, pse_pwm2, and pse_pwmbetween request different values (10, 24000, and 94000) of a driver clock frequency. To resolve the conflicting requested values, conflict manager 16 calculates new values 10, 24000, and 94118. These new values resolve the conflict and closely match the requested values according to a predetermined optimization criterion. The user may accept these new values by pressing an OK button 44. Alternatively, the user may adjust one or more of the requested values by first selecting a row including the value to be modified and enter an adjusted value into a box 410. The user may press a modify button 415 to replace the requested value being selected with the adjusted value. The user may be reminded that the adjusted value should not exceed the range of valid values displayed in an allowable range element 418. Thereafter, the user may press a calculate button 43 to invoke conflict evaluation and, if necessary, conflict update. Conflict manager 16 evaluates whether the adjustment resolves the conflict. GUI 400 disappears if the conflict is resolved by the user's adjustment. If the conflict is not resolved, conflict manager 16 may calculate an update and propose the same or another set of new values to resolve the conflict. The user may further adjust the requested values or accepted the updated new values.

Conflict management GUI 400 may also include a cancel button 45 to cancel the current operation and a help button 46 to obtain information about the GUI operations.

The global resource conflict management GUI described herein notifies a user that the current configuration results in a conflict of a global resource and allows the user to make the best informed choices to resolve the conflict. A user is given immediate feedback in terms of a system-level driver property as opposed to a hardware-level property. Thus, the effect of the conflict is shown in a meaningful context to the user. Moreover, sufficient information is forwarded to a GUI so that a user can make informed decisions about driver property changes.

In one embodiment, the global resource conflict management described herein may be used in a design tool for embedded applications, e.g., PSoC Express™, available from Cypress Semiconductor, Inc., with headquarters in San Jose, Calif. Alternatively, the global resource conflict management may be used in other design tools.

Figure 5:
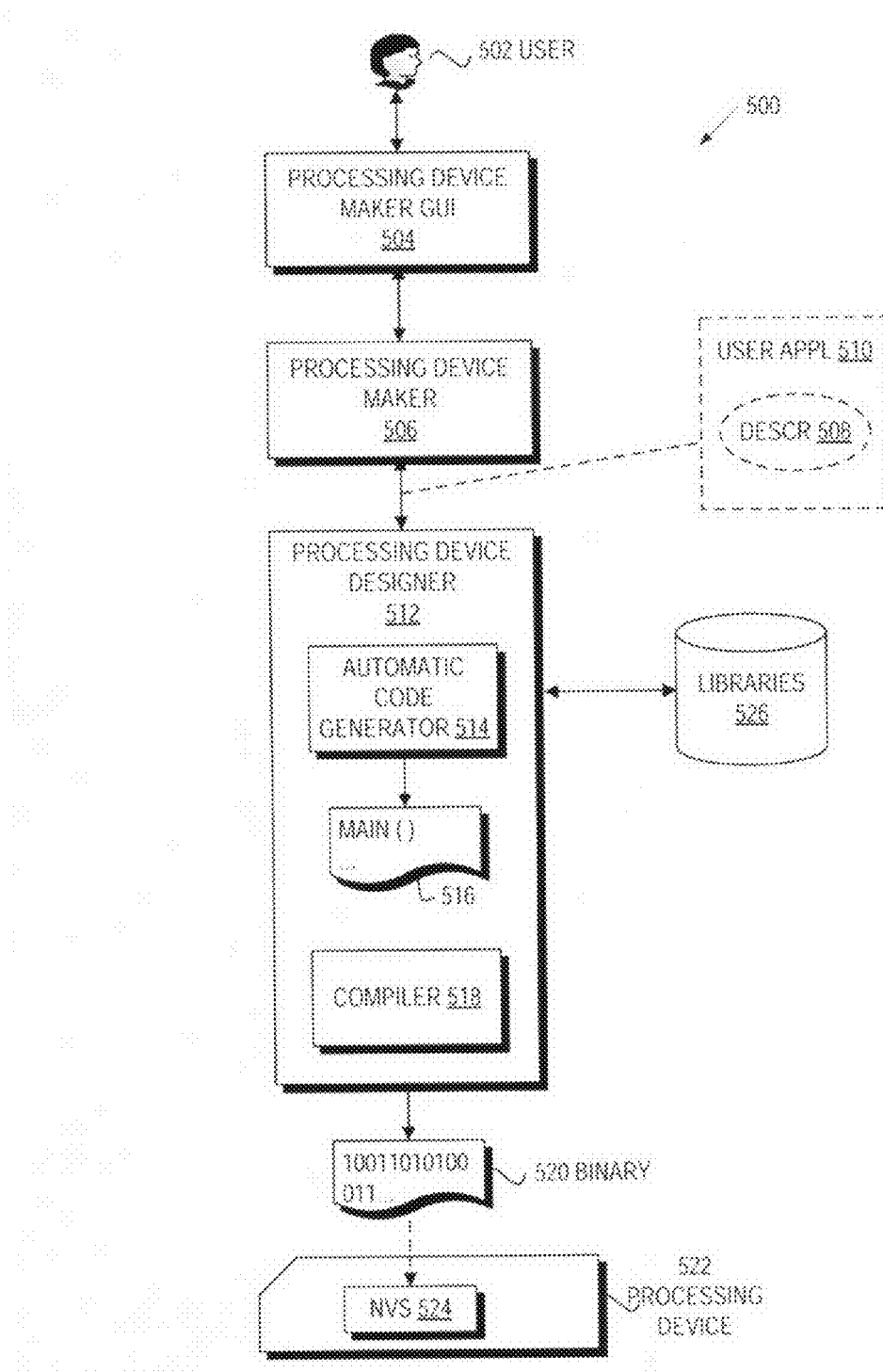
FIG. 5 is a block diagram of one embodiment of a system enabling automated code generation of processing device firmware.

FIG. 5 illustrates an exemplary system 500 in which embodiments of the present invention may operate. System 500 provides automated code generation of processing device firmware in accordance with one embodiment of the present invention.

System 500 includes a processing device maker GUI 504 that may be used by a user 502 to construct a user application 510 for implementation on a processing device 522. The processing device maker GUI 504 overlays a processing device maker 506. The conflict management GUI 400 discussed above in conjunction with FIG. 4 may represent a pop-up window in the processing devices maker GUI 504. In addition, design module 100 of FIG. 1 may be used as part of system 500 to generate processing device maker GUI 504 and facilitate its functionality during the design of the user application 510.

User application 510 may be described in a user application description 508. In one embodiment, user application description 508 is a text file that describes user's application 510.

After user 502 completes the design of application 510, user 502 may perform a simulation of user application 510. The simulation capability enables hardware independence by verifying the transfer function behavior without requiring the user to compile and debug the firmware on the targeted processing device. Simulation also includes the ability to create complex input files to exhaustively test the transfer function behavior with arbitrarily large combinations of input values. The simulation logs the outputs based on the transfer function behavior so that the results may be analyzed by the user.

Next, user 502 may request via processing device maker GUI 504 that processing device code be automatically generated. User 502 does not have to perform any actual coding. In one embodiment, after user 502 selects the targeted processing device, user application description 508 is handed-off to a processing device designer 512 for the generation of processing device code. Processing device designer 512 may include an automatic code generator 514 that assembles the code for user's application 510 based on the user application description 508. Automatic code generator 514 generates processing device code 516 (e.g., high-level language code, such as C, low-level code, such as Assembly, or a combination thereof).

In one embodiment, automatic code generator 514 references libraries 526 that include code blocks that may be combined to form code 516. Automatic code generator 516 may use at least a portion of user application description 508 as a guide in gathering together various code blocks. Some of the code blocks may be selected based at least in part on targeted processing device 522.

A compiler 518 compiles code 516 to generate a binary 520, also known as a binary image or a Read-Only Memory (ROM) image. Binary 520 is loaded into a Non-Volatile Storage (NVS) 524 of the processing device 522. In one embodiment, NVS 524 includes Flash memory.

Embodiments of processing device 522 may include one or more general-purpose processing devices, such as a microprocessor or central processing unit, a network processor, a microcontroller, an embedded Programmable Logic Device (PLD), or the like. Alternatively, the processing device may include one or more special-purpose processing devices, such as a Digital Signal Processor (DSP), an Application Specific Integrated Circuit (ASIC), a Field Programmable Gate Array (FPGA), or the like. The processing device may also include any combination of a general-purpose processing device and a special-purpose processing device.

It will be appreciated that because code 516 is constructed from pre-built and pre-tested code libraries, time wasted on debugging, such as finding syntax errors, is eliminated. It will also be appreciated that user 502 has generated user application 510 without referencing a targeted processing device. Instead of choosing a processing device to implement a user application and then writing code for that processing device, embodiments of the present invention allow a user application to be created and then code automatically generated for a particular processing device. Moreover, a user may take a user application, make revisions to the user application, and quickly generate revised programming device code.

Figure 6:
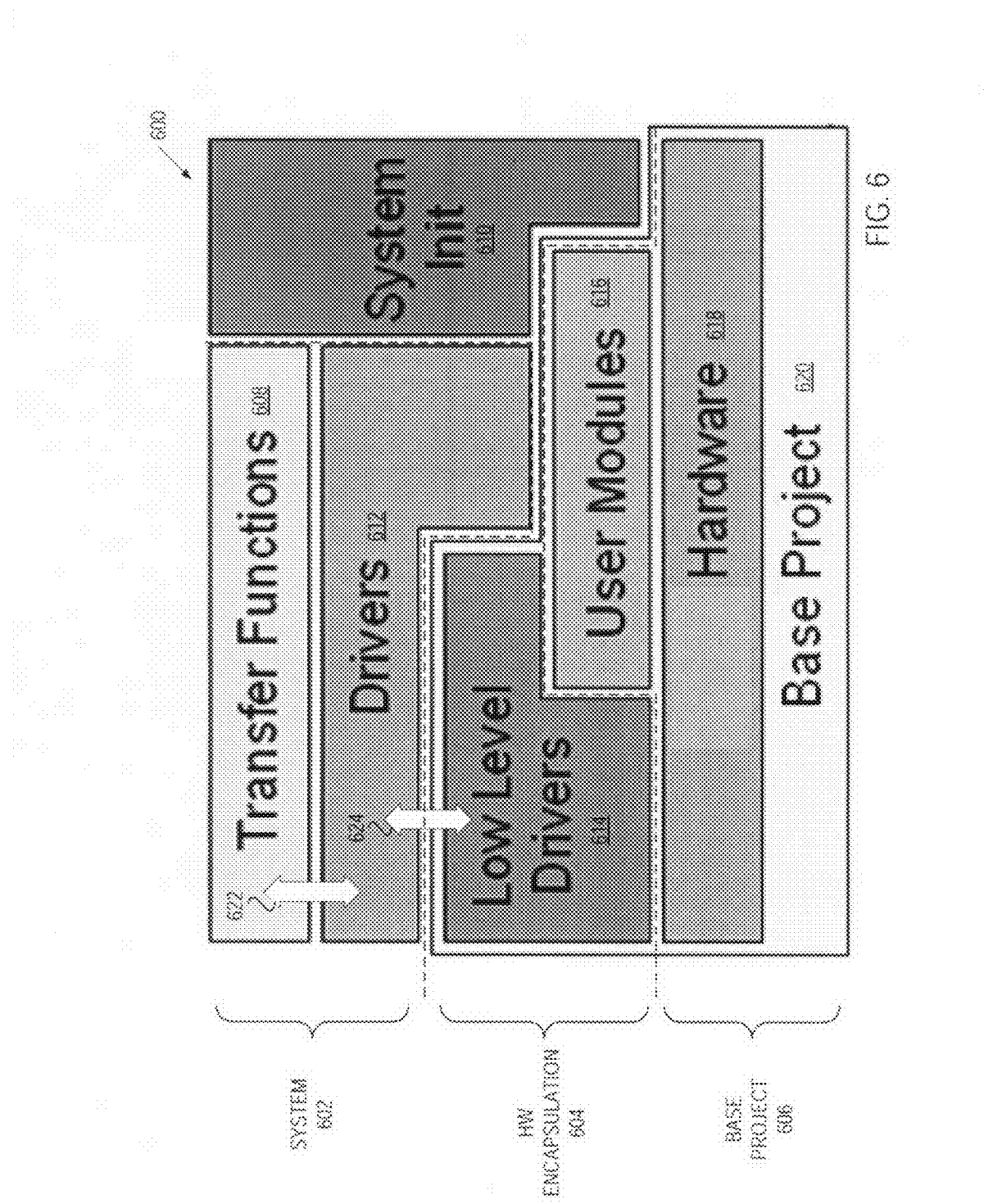
FIG. 6 illustrates a firmware stack in accordance with one embodiment of the present invention.

Referring to FIG. 6, a firmware stack 600 in accordance with one embodiment of the invention is shown. Firmware stack 600 shows a logical structure of at least a portion of the processing device code 516. Data module 15 of FIG. 1 may include at least of portion of firmware stack 600. As discussed below, a portion of the stack is abstracted away from specific hardware. Such hardware independency provides the automatic code generator a consistent architecture for stitching together various code blocks.

Firmware stack 600 includes a system layer 602, a hardware encapsulation layer 604, and a base project layer 606. As will be described further below, the functionality of the system layer 602 is independent of the targeted processing device. Also, interfaces, such as Application Program Interfaces (APIs), made between system layer 602 and the remaining layers of firmware stack 600 are standardized regardless of the targeted processing device. The term "standardized" refers to the hardware independence of the APIs. This abstraction away from specific hardware allows system layer 602 to function without regard to the particular hardware. The low layers of firmware stack 600 have "knowledge" of the specific hardware and take care of the implementation details for system layer 602.

Hardware encapsulation layer 604 and base project layer 606 are generated based at least in part on the targeted processing device. Hardware encapsulation layer 604 represents the underlying hardware to system layer 602. Base project layer 606 includes a set of standard functions associated with the targeted processing device hardware. Base project layer 606 may include functionality at the register level of the targeted processing device. Base project metadata 17 discussed above in conjunction with FIG. 1 may be part of base project layer 606.

System layer 602 may include transfer functions 608 and drivers 612. System layer 602 is targeted by an application level mapping function. Transfer functions 608 invoke the transfer functions defined by the user 602.

Drivers 612 are usually associated with a hardware component of the processing device. In one embodiment, drives 612 may include three types: input, output, or interface. An output driver may be used with a device that is controlled by the user application, such as a fan or heater. Input drivers may be used for sensors, such as temperature or voltage sensors. Interface drivers may be used for devices that allow access to system variables and status, such as an Inter-Integrated Circuit (I2C) or a Serial Peripheral Interface (SPI). Driver metadata 13 discussed above in conjunction with FIG. 1 may be part of drivers 612.

Transfer functions 608 and drivers 612 may communicate with each other using APIs 622. Embodiments of an API include DriverName-Instantiate to initialize a device, DriverName_GetValue to return a value from an input device, and DriverName_SetValue to set an output of an output device to a specific value. Such APIs are defined such that the may be invoked regardless of the particular hardware.

Drivers 612 communicate with hardware encapsulation layer 604 using channels 624. Channels 624 are hardware independent. A channel may be further defined by a channel type, such as an input voltage channel, an output voltage channel, or the like. In one embodiment, channels 624 are implemented as APIs. Channel metadata 14 discussed above in conjunction with FIG. 1 may be part of channels 624.

Hardware encapsulation layer 604 may include low level drivers 614 and system initialization 610. Low level drivers 614 provide the implementation of channels 624. In one embodiment, all drivers 612 use one or more channels 624 to communicate with low level drivers 614. In one embodiment, a channel may have associated parameters assigned by a low level driver, and the associated driver must conform to those parameters.

In one embodiment, the base project layer 606 includes User Modules (UMs) 616 and processing device hardware 618. User modules 616 are used with block arrays in processing device hardware 618 to form hardware components, such as an Analog-Digital Converter (ADC).

FIG. 6 also shows low level drivers 614, user modules 616, and Hardware 618 grouped into a Base Project 620.

Figure 7:
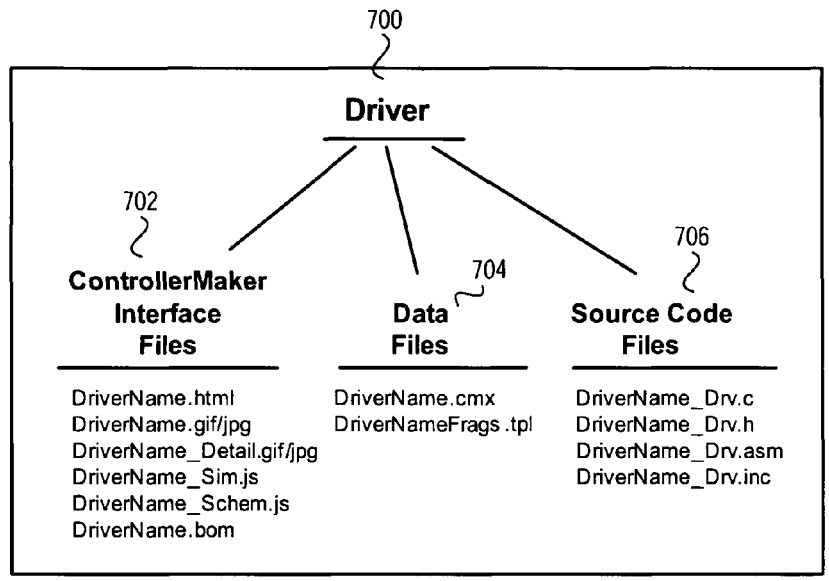
FIG. 7 illustrates a driver in accordance with one embodiment of the present invention.

Turning to FIG. 7, an embodiment of driver 700 is shown. In one embodiment, driver 700 includes several components for device selection and code generation. These components may be grouped into ControllerMaker Interface files 702, Data files 704, and Source Code files 706. Interface files 702 may include files to generate the visual interface in processing device maker GUI 504. Data files 704 are used for driver type selection, resource allocation, user parameter selection, and code generation. Data files 704 may include a driver name file that includes information about channel type, resource requirements, association with image files, and user selectable parameters. In one particular embodiment, the driver name file may be a DriverName.cmx file. The .cmx file extension indicates that the file can be used by a CMX engine, which is a proprietary design tool engine from Cypress Semiconductor, Inc. It is understood that other design tool engines and file formats may also be used. Source code files 706 include the driver firmware. Driver 700 may be written in C, Assembly, or a combination thereof.

Figure 8:
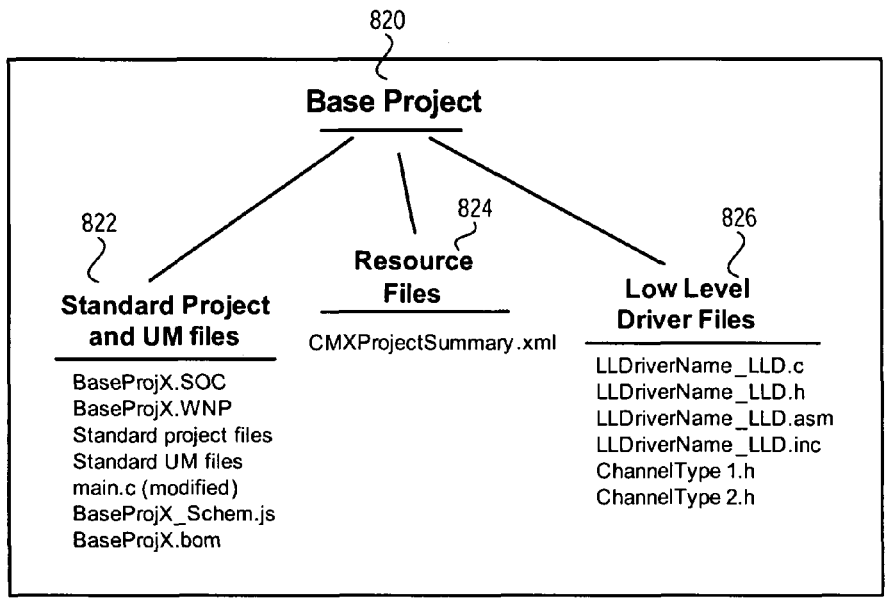
FIG. 8 illustrates a base project in accordance with one embodiment of the present invention.

Turning to FIG. 8, an embodiment of a base project 820 is shown. In one embodiment, base project 820 is built around the targeted processing device. Automatic code generator 514 refers to user application description 508 and adds the appropriate code for the drivers and transfer functions. The standardized calls to and from the drivers provide a consistent architecture for reliably connecting base project 820 to drivers.

Base project 820 may include any system design project using any of the processing device family of parts that support one or more driver channel types. In one embodiment, if a base project supports a given channel type, it must support it fully. The channel may support an external interface to the input or output signal as well as low level firmware to support the signal acquisition and signal conditioning required for reliable signal measurement. Processing device designer 512 adds drivers, such as driver 700, to a base project to support the input/output devices selected by user 502 in user application 510. A project summary file is included in a base project to define what channel types are supported and how many channels are available.

Base project 820 may include standard project and UM files 822, resource files 824, and low level driver files 826. Standard project and UM files 822 may include files that describe the specific user modules employed in the design project and their specific placement. The UM's and their placement determine the mapping of the channels to the external pins. With the UM configuration file, specific UM API files are included in so much as they are needed to control specific interrupt behavior required for successful signal acquisition and conditioning. By themselves these files create an empty project.

Low level driver files 826 provide the implementation of the channels supported by a given base project. A variety of ways can be used to implement a given channel type. For example, a volts channel can be supported by a wide range of ADCs, multiplexers, and ADC resolutions, as long as the API for the specific channel is fully supported. Some base projects may offer more resolution than others for certain channel types. These differences may be specified in a project summary file, e.g., a CMXProjectSummary.xml file. The CMX file prefix indicates that the file can be used by a CMX engine, which is one embodiment of design tool engine 18 of FIG. 1. It is understood that other design tool engines and file formats may also be used.

Resource files may include the project summary file, which may be an eXtensible Markup Language (XML) file contains metadata that communicate a list of resources provided by the base project to design tool engine 18. The XML file indicates the types and count of each of the resource channels and interfaces supported. It also determines the channel assignment order and prioritization, in the case of channels competing for similar resources. It may also provide specifications of each of the channel types, where applicable.

Figure 9:
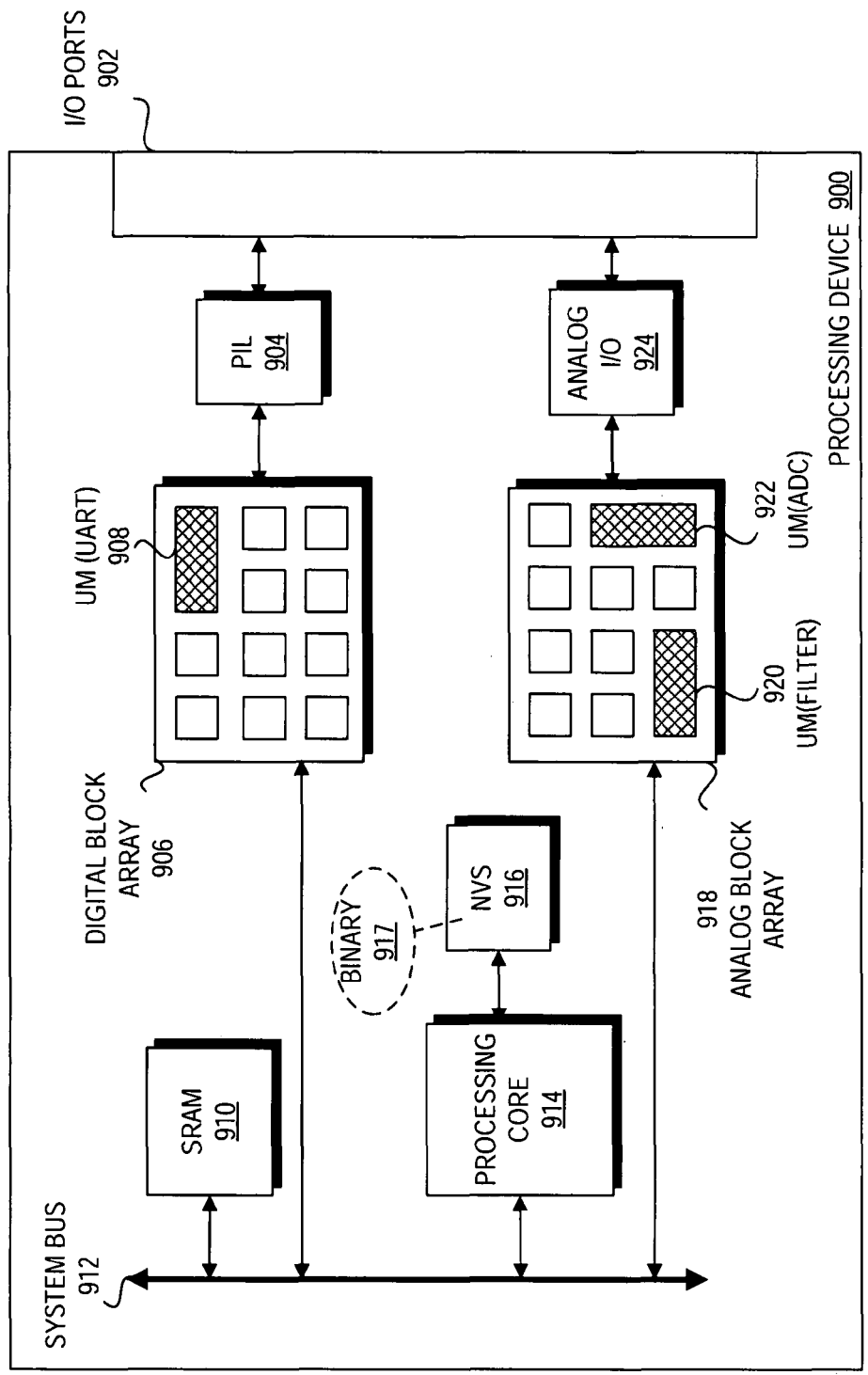
FIG. 9 is a block diagram of one embodiment of a processing device.

Turning to FIG. 9, an embodiment of a processing device 900 is shown. Processing device 900 includes a microcontroller. Processing device 900 includes Input/Output (I/O) ports 902. In one embodiment, I/O ports 902 are programmable. I/O ports 902 are coupled to a Programmable Interconnect and Logic (PIL) 904 which is coupled to a digital block array 906. In FIG. 9, digital block array 906 includes a UM 908 that has been configured as a Universal Asynchronous Receive/Transmitter (UART). Digital block array 906 is coupled to a system bus 912.

A Static Random Access Memory (SRAM) 910 and a processing core 914 are also coupled to system bus 912. Processing core 914 is coupled to NVS 916 which has stored a binary 917. In one embodiment, binary 917 includes instructions generated as described herein. In another embodiment, binary 917 may include instructions executable by processing core 914 as well as instructions for configuring block arrays 916 and 918.

Analog block array 918 is coupled to system bus 912. In the embodiment of FIG. 9, analog block array 918 includes a UM 920 configured as a filter and a UM 922 configured as an ADC. Analog block array 918 is also coupled to an analog I/O unit 924 which is coupled to I/O ports 902. Processing device 900 may also include other components, not shown for clarity, including a clock generator, an interrupt controller, an I2C, or the like.

Figure 10:
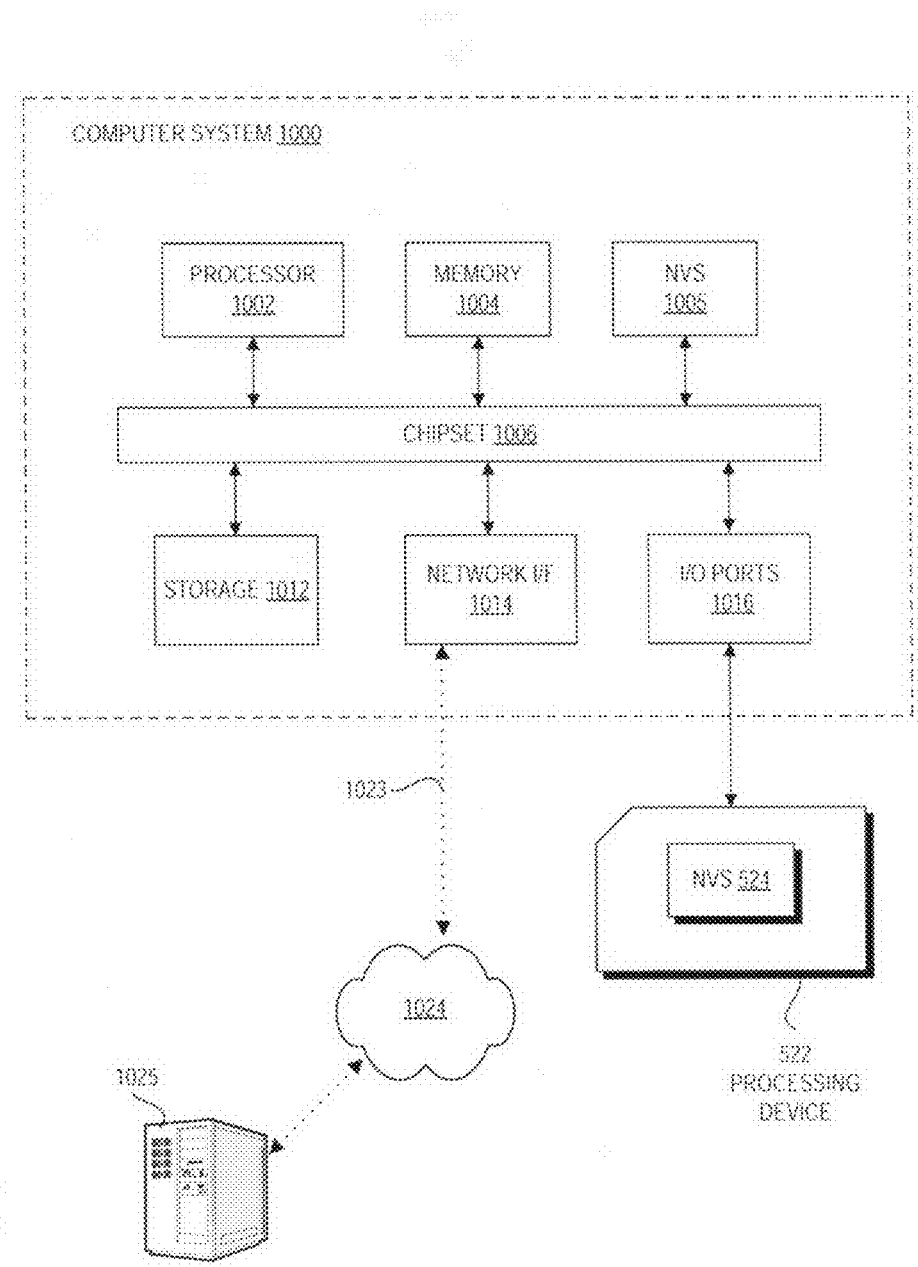
FIG. 10 is a block diagram of one embodiment of a computer system.

FIG. 10 illustrates an exemplary computer system 1000 on which embodiments of the present invention may be implemented. Computer system 1000 includes a processor 1002 and a memory 1004 coupled to a chipset 1006. Storage 1012, Non-Volatile Storage (NVS) 1005, network interface (I/F) 1014, and Input/Output (I/O) ports 1018 may also be coupled to chipset 1006. Embodiments of computer system 1000 include, but are not limited to, a desktop computer, a notebook computer, a server, a personal digital assistant, a network workstation, or the like. In one embodiment, processor 1002 executes instructions stored in memory 1004.

Memory 1004 may include, but is not limited to, Dynamic Random Access Memory (DRAM), Static Random Access Memory (SRAM), Synchronized Dynamic Random Access Memory (SDRAM), or the like.

Chipset 1006 may include a memory controller and an input/output controller. Chipset 1006 may also include system clock support, power management support, audio support, graphics support, or the like. In one embodiment, chipset 1006 is coupled to a board that includes sockets for processor 1002 and memory 1004.

Components of computer system 1000 may be connected by various interconnects. Such interconnects may include a Peripheral Component Interconnect (PCI), a System Management bus (SMBUS), a Low Pin Count (LPC) bus, a Serial Peripheral Interface (SPI) bus, an Accelerated Graphics Port (AGP) interface, or the like.

I/O ports 1016 may include ports for a keyboard, a mouse, a display, a printer, a scanner, or the like. Embodiments of I/O ports 1016 include a Universal Serial Bus port, a Firewire port, a Video Graphics Array (VGA) port, a Personal System/2 (PS/2) port, or the like.

Processing device 522 may be coupled to computer system 1000 via I/O ports 1016. Computer system 1000 may have stored computer-readable instructions, in accordance with embodiments described herein, to allow a user to design application 510 using UIs described herein and automatically generate processing device code for processing device 522 using computer system 1000. This code may be compiled into a binary and loaded into NVS 524.

Computer system 1000 may interface to external systems through network interface 1014. Network interface 1014 may include, but is not limited to, a modem, a Network Interface Card (NIC), or other interfaces for coupling a computer system to other computer systems. A carrier wave signal 1023 may be received and transmitted by network interface 1014. In the embodiment illustrated in FIG. 10, carrier wave signal 1023 is used to interface computer system 1000 with a network 1024, such as a Local Area Network (LAN), a Wide Area Network (WAN), the Internet, or any combination thereof. In one embodiment, network 1024 is further coupled to a computer system 1025 such that computer system 1000 and computer system 1025 may communicate over network 1024.

Computer system 1000 also includes non-volatile storage 1005 on which firmware and/or data may be stored. Non-volatile storage devices include, but are not limited to, Read-Only Memory (ROM), Flash memory, Erasable Programmable Read Only Memory (EPROM), Electronically Erasable Programmable Read Only Memory (EEPROM), Non-Volatile Random Access Memory (NVRAM), or the like. Storage 1012 includes, but is not limited to, a magnetic disk drive, a magnetic tape drive, an optical disk drive, or the like. It is appreciated that instructions executable by processor 1002 may reside in storage 1012, memory 1004, non-volatile storage 1005, or may be transmitted or received via network interface 1014.

For the purposes of the specification, a machine-readable medium includes any mechanism that provides (i.e., stores and/or transmits) information in a form readable or accessible by a machine (e.g., a computer, network device, personal digital assistant, manufacturing tool, any device with a set of one or more processors, etc.). For example, a machine-readable medium includes, but is not limited to, recordable/non-recordable media (e.g., Read-Only Memory (ROM), Random Access Memory (RAM), magnetic disk storage media, optical storage media, a flash memory device, etc.).

Various operations of embodiments of the present invention are described herein. These operations may be implemented by a machine using a processor, an Application Specific Integrated Circuit (ASIC), a Field Programmable Gate Array (FPGA), or the like. In one embodiment, one or more of the operations described may constitute instructions stored on a machine-readable medium, that when executed by a machine will cause the machine to perform the operations described. The order in which some or all of the operations are described should not be construed as to imply that these operations are necessarily order dependent. Alternative ordering will be appreciated by one skilled in the art having the benefit of this description. Further, it will be understood that not all operations are necessarily present in each embodiment of the invention.

What is claimed is:

1. A computer implemented method, comprising:
receiving instructions for a design of an embedded application, the design comprising a first driver and a second driver of a plurality of drivers, wherein the first driver and the second driver each request a different value of a global resource shared by the first driver and the second driver, and wherein the global resource comprises a common resource shared by the plurality of drivers to support the embedded application;
determining whether there is a conflict between the values of the global resource requested by the first driver and the second driver of the plurality of drivers, wherein determining whether there is a conflict comprises determining whether a first value of the global resource requested by the first driver of the plurality of drivers is different than a second value of the global resource requested by the second driver of the plurality of drivers;
notifying a user, with a graphical user interface (GUI), that the first value of the global resource requested by the first driver of the plurality of drivers results in a conflict with the second value of the global resource requested by the second driver of the plurality of drivers, during development of the embedded application;
receiving a first set of new values for the global resource input by the user, the first set of new values to resolve the conflict;
if the first set of new values does not resolve the conflict, calculating a second set of new values for the global resource, the second set of new values approximating the first and second values requested by the first and second drivers while resolving the conflict and optimizing an error metric for the global resource, the error metric comprising at least one of a total average error or a mean square error;
presenting, in the GUI, the second set of new values as a feedback to the first and second requested values; and
providing the user with a user interface element to adjust the requested values until the conflict is resolved.

2. The method of claim 1, further comprising:
presenting the requested values as a system-level property, which corresponds to, but is different from, a hardware-level property of the global resource.

3. The method of claim 1, further comprising:
providing an indicator for the user to accept the new values.

4. The method of claim 1 further comprising:
presenting, in the GUI, an allowable range for the requested values.

5. The method of claim 1, further comprising:
sending the adjusted values to a conflict manager; and
rendering the GUI only if the conflict manager is unable to resolve the conflict.

6. A user interface, implemented by a computing device having a processor, the user interface comprising:
a message to notify a user of a conflict between the values of the global resource requested by a first driver and a second driver of a plurality of drivers, wherein the conflict results when a first value of the global resource requested by the first driver of the plurality of drivers is different than the second value of the global resource requested by the second driver of the plurality of drivers, wherein the computing device receives instructions for a design of an embedded application, the design comprising the plurality of drivers, each requesting a different value of the global resource, wherein the global resource is shared by the first driver and the second driver, and wherein the global resource comprises a common resource shared by the plurality of drivers to support the embedded application;
a first user interface element to display the requested values and to receive a first set of new values for the global resource input by the user, the first set of new values to resolve the conflict; and
a second user interface element to display a second set of new values of the global resource as a feedback to the requested values if the first set of new values does not resolve the conflict, the second set of new values approximating the first and second values requested by the first and second drivers while resolving the conflict and optimizing an error metric for the global resource, the error metric comprising at least one of a total average error or a mean square error.

7. The user interface of claim 6, wherein the requested values are presented as a system-level property, which corresponds to, but is different from, a hardware-level property of the global resource.

8. The user interface of claim 4, further comprising:
an indicator for the user to accept the new values.

9. The user interface of claim 6, wherein the new values are displayed adjacent to the requested values in a corresponding order.

10. The user interface of claim 6, further comprising:
a driver name element, adjacent to each of the requested values, to indicate a driver of the embedded application.

11. The user interface of claim 6, further comprising:
an allowable range element to indicate an allowable range of the requested values.

12. A non-transitory machine-readable storage medium including a plurality of instructions which when executed, cause a processing device to perform a method comprising:
receiving instructions for a design of an embedded application, the design comprising a first driver and a second driver of a plurality of drivers, wherein the first driver and the second driver each request a different value of a global resource shared by the first driver and the second driver, and wherein the global resource comprises a common resource shared by the plurality of drivers to support the embedded application;
determining whether there is a conflict between the values of the global resource requested by the first driver and the second driver of the plurality of drivers, wherein determining whether there is a conflict comprises determining whether a first value of the global resource requested by the first driver of the plurality of drivers is different than a second value of the global resource requested by the second driver of the plurality of drivers;
notifying a user, with a graphical user interface (GUI), that the first value of the global resource requested by the first driver of the plurality of drivers results in a conflict with the second value of the global resource requested by the second driver of the plurality of drivers, during development of the embedded application;
receiving a first set of new values for the global resource input by the user, the first set of new values to resolve the conflict;
if the first set of new values does not resolve the conflict, calculating a second set of new values for the global resource, the second set of new values approximating the first and second values requested by the first and second drivers while resolving the conflict and optimizing an error metric for the global resource the error metric comprising at least one of a total average error or a mean square error;

presenting, in the GUI, the second set of new values as a feedback to the first and second requested values; and providing the user with a user interface element to adjust the requested values until the conflict is resolved.

13. The article of manufacture of claim 12, wherein the method further comprises:

presenting the requested values as a system-level property, which corresponds to, but is different from, a hardware-level property of the global resource.

14. The article of manufacture of claim 12, wherein the method further comprises:

providing an indicator for the user to accept the new values.

15. The article of manufacture of claim 12, wherein the method further comprises:

presenting, in the GUI, an allowable range for the requested values.

16. A computer implemented method, comprising:

receiving instructions for a design of an embedded application, the design comprising a first driver and a second driver of a plurality of drivers, wherein the first driver and the second driver each request a different value of a global resource shared by the first driver and the second driver, and wherein the global resource comprises a common resource shared by the plurality of drivers to support the embedded application;

determining whether there is a conflict between the values of the global resource requested by the first driver and the second driver of the plurality of drivers, wherein determining whether there is a conflict comprises determining whether a first value of the global resource requested by the first driver of the plurality of drivers is different than a second value of the global resource requested by the second driver of the plurality of drivers;

notifying a user, with a graphical user interface (GUI), that the first value of the global resource requested by the first driver of the plurality of drivers results in a conflict with the second value of the global resource requested by the second driver of the plurality of drivers, during development of the embedded application; and receiving a first set of new values for the global resource input by the user, the first set of new values to resolve the conflict;

if the first set of new values does not resolve the conflict, calculating a second set of new values for the global resource, the second set of new values approximating the first and second values requested by the first and second drivers while resolving the conflict and optimizing an error metric for the global resource, resource the error metric comprising at least one of a total average error or a mean square error;

presenting, in the GUI, the second set of new values as a feedback to the first and second requested values.

* * * * *